(12) United States Patent
Premerlani et al.

(10) Patent No.: US 10,203,363 B2
(45) Date of Patent: Feb. 12, 2019

(54) DC LEAKAGE CURRENT DETECTOR AND METHOD OF OPERATION THEREOF FOR LEAKAGE CURRENT DETECTION IN DC POWER CIRCUITS

(71) Applicant: General Electric Company, Schenectady, NY (US)

(72) Inventors: William James Premerlani, Scotia, NY (US); Ibrahima Ndiaye, Latham, NY (US); Kum-Kang Huh, Niskayuna, NY (US); Ahmed Elasser, Latham, NY (US)

(73) Assignee: General Electric Company, Schenectady, NY (US)

( * ) Notice: Subject to any disclaimer, the term of this patent is extended or adjusted under 35 U.S.C. 154(b) by 176 days.

(21) Appl. No.: 15/379,160

(22) Filed: Dec. 14, 2016

(65) Prior Publication Data

US 2018/0164362 A1 Jun. 14, 2018

(51) Int. Cl.
 *G01R 31/00* (2006.01)
 *B60L 11/18* (2006.01)
 (Continued)

(52) U.S. Cl.
 CPC ........ *G01R 31/007* (2013.01); *B60L 11/1809* (2013.01); *G01R 15/18* (2013.01);
 (Continued)

(58) Field of Classification Search
 CPC ............ G01R 33/3621; G01R 33/5616; G01R 33/3642; G01R 33/3692
 (Continued)

(56) References Cited

U.S. PATENT DOCUMENTS 5,465,010 A 11/1995 Rimmer
5,508,872 A 4/1996 Khoo et al.
(Continued)

FOREIGN PATENT DOCUMENTS

CN 2141901 Y 9/1993
CN 101846711 B 9/2010
(Continued)

OTHER PUBLICATIONS

"Industry-Oriented Solutions," Retrieved from the Internet URL: http://www.bender-us.com/, on Jun. 1, 2018, pp. 1-2.
(Continued)

*Primary Examiner* — Giovanni Astacio-Oquendo
(74) *Attorney, Agent, or Firm* — Ziolkowski Patent Solutions Group, SC; Jean K. Testa

(57) ABSTRACT

The DC leakage current detector for detecting leakage current in a DC bus includes a pair of transformers each comprising a magnetic core and excitation and detection windings would about the magnetic core, with the magnetic core positionable about a pair of conductors that create a magnetic field that is a sum of currents in the conductors. An excitation and biasing circuit is connected to the excitation winding in each transformer to inject a current signal thereto that creates a changing magnetic flux in the core of each transformer and a detector output connected to the detection winding in each transformer to receive a voltage therefrom generated responsive to the magnetic flux in the core of each transformer, wherein the voltage on the detection windings provides a net voltage at the detector output whose value is indicative of a presence of a leakage current on the DC bus.

20 Claims, 6 Drawing Sheets

(51) Int. Cl.
*H02M 1/32* (2007.01)
*G01R 31/02* (2006.01)
*G01R 15/18* (2006.01)
*G01R 19/00* (2006.01)
*G01R 31/08* (2006.01)

(52) U.S. Cl.
CPC ....... *G01R 19/0092* (2013.01); *G01R 31/025* (2013.01); *H02M 1/32* (2013.01); *B60L 2210/10* (2013.01); *B60L 2270/00* (2013.01); *G01R 31/08* (2013.01); *Y10S 903/903* (2013.01)

(58) Field of Classification Search
USPC .......................................... 324/300, 318, 322
See application file for complete search history.

(56) References Cited

U.S. PATENT DOCUMENTS

| | | | |
|---|---|---|---|
| 6,388,451 B1 | 5/2002 | Burba et al. | |
| 6,421,618 B1 | 7/2002 | Kliman et al. | |
| 7,365,521 B2 | 4/2008 | Patterson | |
| 7,583,483 B2 | 9/2009 | Trenchs et al. | |
| 8,289,664 B2 | 10/2012 | Haines et al. | |
| 8,472,154 B2 | 6/2013 | Rivers, Jr. et al. | |
| 9,046,580 B2 | 6/2015 | Hermann | |
| 9,090,169 B2 | 7/2015 | Ang et al. | |
| 9,244,110 B2 | 1/2016 | Ward | |
| 9,274,158 B2 | 3/2016 | Tang et al. | |
| 9,397,494 B2 | 7/2016 | Hofheinz et al. | |
| 2002/0130664 A1* | 9/2002 | Birken | G01V 3/15 324/329 |
| 2006/0217906 A1* | 9/2006 | Barbara | G01R 1/36 702/60 |
| 2007/0200563 A1* | 8/2007 | Daalmans | G01N 27/9006 324/237 |
| 2010/0281854 A1* | 11/2010 | Huang | F02D 41/1495 60/276 |
| 2012/0182023 A1* | 7/2012 | Zhang | G01M 11/3109 324/501 |
| 2012/0306264 A1 | 12/2012 | Komma et al. | |
| 2014/0091787 A1* | 4/2014 | Hyodo | G01V 3/105 324/236 |
| 2014/0320112 A1 | 10/2014 | Nodera et al. | |

FOREIGN PATENT DOCUMENTS

| | | |
|---|---|---|
| DE | 1 946 608 A1 | 3/1971 |
| DE | 25 55 255 A1 | 6/1977 |
| EP | 0 261 707 A1 | 3/1988 |
| FR | 2 744 529 A1 | 8/1997 |
| JP | H05-188089 A | 7/1993 |
| JP | H11-64391 A | 3/1999 |
| JP | H11-337591 A | 12/1999 |
| JP | 2007-316042 A | 12/2007 |
| JP | 2012-153197 A | 8/2012 |
| JP | 2015-068725 A | 4/2015 |
| WO | 2013/111414 A1 | 8/2013 |
| WO | 2014122647 A1 | 8/2014 |
| WO | 2015/087098 A1 | 6/2015 |
| WO | 2015/106975 A1 | 7/2015 |

OTHER PUBLICATIONS

Brown, K., "Safety of Electric Vehicle Supply Equipment," IEEE Transportation Electrification Community, pp. 1-3 (Oct. 2013).
International Search Report and Written Opinion issued in connection with corresponding PCT Application No. PCT/US2017/57513 dated Jan. 31, 2018.
Rivers et al., "Leakage Current Discrimination and Masking from Upstream Ground Fault Protection Devices During Electric Vehicle Charging," IEEE International Electric Vehicle Conference, Greenville, SC, 2012, pp. 1-6.
Jeong et al., "Fault Detection and Fault-Tolerant Control of Interior Permanent-Magnet Motor Drive System for Electric Vehicle," IEEE Transactions on Industry Applications, vol. 41, No. 1, Jan./Feb. 2005, pp. 46-51.

* cited by examiner

DC LEAKAGE CURRENT DETECTOR AND METHOD OF OPERATION THEREOF FOR LEAKAGE CURRENT DETECTION IN DC POWER CIRCUITS

BACKGROUND OF THE INVENTION

The invention relates generally to a DC power circuit in hybrid and electric vehicles and, more particularly, to DC leakage current detectors that may be employed for leakage current detection and fault location identification in a DC power circuit in hybrid and electric vehicles.

Hybrid electric vehicles may combine an internal combustion engine and an electric motor powered by an energy storage device, such as a traction battery, to propel the vehicle. Such a combination may increase overall fuel efficiency by enabling the combustion engine and the electric motor to each operate in respective ranges of increased efficiency. Electric motors, for example, may be efficient at accelerating from a standing start, while combustion engines may be efficient during sustained periods of constant engine operation, such as in highway driving. Having an electric motor to boost initial acceleration allows combustion engines in hybrid electric vehicles to be smaller and more fuel efficient.

Purely electric vehicles use stored electrical energy to power an electric motor, which propels the vehicle and may also operate auxiliary drives. Purely electric vehicles may use one or more sources of stored electrical energy. For example, a first source of stored electrical energy may be used to provide longer-lasting energy while a second source of stored electrical energy may be used to provide higher-power energy for, for example, acceleration.

Plug-in electric vehicles, whether of the hybrid electric type or of the purely electric type, are configured to use electrical energy from an external source to recharge the traction battery. Such vehicles may include on-road and off-road vehicles, golf cars, neighborhood electric vehicles, forklifts, and utility trucks as examples. These vehicles may use either off-board stationary battery chargers or on-board battery chargers to transfer electrical energy from a utility grid or renewable energy source to the vehicle's on-board traction battery. Plug-in vehicles may include circuitry and connections to facilitate the recharging of the traction battery from the utility grid or other external source, for example. Additionally, an export power inverter may be provided that is able to invert power received from the DC bus of the vehicle and output an AC power that may be provided back to the utility grid or to another AC load that might require power.

The DC power circuit of the vehicle—i.e., the energy storage device(s), battery charger, export inverter and traction motor or other loads connected to a DC bus/network in the vehicle—are generally operated such that they are electrically isolated from the vehicle frame, such that a fault (short circuit) between one of the DC power conductors and the vehicle frame does not produce large fault currents. While such protection is provided due to the isolation of the DC power circuit from the vehicle frame, it is recognized that it is desirable to detect high impedance, low leakage current faults in the DC power circuit during operation of the vehicle, such that a protection strategy is provided to detect a fault and turn off power in the DC power circuit before a second fault develops. Furthermore, in the case that the fault is a leakage current through a person, it is desired to limit the amount of current needed to detect the fault to low levels.

An example of ground fault circuitry as known in the art for detecting leakage current to a vehicle frame as presented by TDI Power, Inc. is shown in FIG. 1, where a vehicle DC power circuit 2 is illustrated that includes ground fault detection circuitry 4 and associated resistors 6 that functions to detect leakage current to the vehicle frame that arises from a fault anywhere on the DC power bus 8. The ground fault detection circuitry 4 functions to detect a voltage change across the resistor(s) 6 that is indicative of a leakage current in the DC power circuit 2. The actual voltage during a fault depends on the ratio of the resistance of the fault leakage path to the resistance of the two biasing resistors 6. For the values of the resistors 6 shown in FIG. 1, the ratio of the resistance of the usual causes of leakage current to the biasing resistance is low enough to produce a significant change in voltage during a fault. During normal conditions, the resistors 6 establish a voltage of 95 volts across the 1 Megaohm resistor. During a fault from positive supply to ground, the voltage across the 1 Megaohm resistor can rise to as high as 380 volts. During a fault from negative supply to ground, the voltage can drop to as low as 0 volts. In the case of the circuit 2 in FIG. 1, the current through a fault from the positive side of the DC bus 8 to the vehicle frame is limited to +0.38 milliamps. For a fault from the negative side of the DC bus 8 to the vehicle frame, the fault current is limited to approximately −0.13 milliamps.

However, while the ground fault detection circuitry of FIG. 1 can detect leakage current to the vehicle frame that arises from a fault anywhere on the DC power bus, the ground fault detection circuitry does not give any indication concerning the location of the fault. That is, the voltage readings acquired/analyzed by the ground fault detection circuitry provides no information on the location of the fault within the vehicle DC power circuit, as the voltage readings are not dependent on the location of the fault. It is recognized that an indication of the location of the fault would be beneficial, in that such information would be useful for diagnostics and repair of the DC power circuit.

It would therefore be desirable to provide a system and method for leakage current detection and fault location identification in a DC power circuit in hybrid and electric vehicles. Such a system and method would employ DC leakage current detectors of a desired construction that are configured to sense DC leakage current in the DC power circuit, so as to enable fault location identification.

BRIEF DESCRIPTION OF THE INVENTION

According to one aspect of the invention, a DC leakage current detector for detecting leakage current in a DC bus is provided. The DC leakage current detector includes a pair of transformers each comprising a magnetic core having an opening positionable about a pair of conductors of the DC bus that create a magnetic field in the magnetic core that is a sum of currents in the conductors and a pair of windings wound about the magnetic core, the pair of windings including an excitation winding and a detection winding. The DC leakage current detector also includes an excitation and biasing circuit connected to the excitation winding in each of the pair of transformers to inject a current signal thereto that creates a changing magnetic flux in the core of each of the transformers and a detector output connected to the detection winding in each of the pair of transformers to receive a voltage therefrom generated responsive to the magnetic flux in the core of each of the transformers, wherein the voltage on the detection windings provides a net voltage at the detector output whose value is indicative of a presence of a leakage current on the DC bus.

In accordance with another aspect of the invention, a method of sensing a leakage current fault in a DC power circuit includes positioning a DC leakage current detector about a pair of conductors of a DC bus in the DC power circuit, the DC leakage current detector comprising a pair of transformers, each of the pair of transformers including a magnetic core positioned about the pair of conductors and an excitation winding and a detection winding wound about the magnetic core, an excitation and biasing circuit to inject a current signal onto the excitation winding of each transformer, and a detector output coupled to the detection winding of each transformer. The method also includes causing the excitation and biasing circuit to inject the current signal onto the excitation winding of each transformer, thereby creating a changing magnetic flux in the core of each of the transformers. The method further includes measuring a voltage on each of the detection windings generated responsive to the magnetic flux in the core of each of the transformers, with the voltage on the detection windings providing a net voltage at the detector output whose value is indicative of a presence of a leakage current on the DC bus.

In accordance with yet another aspect of the invention, a DC leakage current detection system for detecting a leakage current fault in a DC bus of a DC power circuit is provided. The DC leakage current detection system includes a plurality of DC leakage current detectors for detecting leakage current in the DC bus at various locations in the DC power circuit, each of the DC leakage current detectors comprises a pair of transformers each including a magnetic core having an opening positionable about a pair of conductors of the DC bus that create a magnetic field in the magnetic core that is a sum of currents in the conductors and a pair of windings wound about the magnetic core, the pair of windings including an excitation winding and a detection winding. Each of the DC leakage current detectors also includes an excitation and biasing circuit connected to the excitation winding in each of the pair of transformers to inject a current signal thereto, the injected current signal creating a changing magnetic flux in the core of each of the transformers. Each of the DC leakage current detectors further includes a detector output connected to the detection winding in each of the pair of transformers to receive a voltage therefrom generated responsive to the magnetic flux in the core of each of the transformers, wherein the voltage on the detection windings provides a net voltage reading at the detector output whose value is indicative of a presence of a leakage current on the DC bus. The DC leakage current detection system also includes a logic device operably connected with the plurality of DC leakage current detectors, the logic device configured to receive the net voltage reading from each of the plurality of DC leakage current detectors and locate the leakage current fault in the DC power circuit based on the net voltage readings received from the plurality of DC leakage current detectors.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Embodiments of the invention are directed to construction of a DC leakage current detector that may be employed for leakage current detection and fault location identification in a DC power circuit in hybrid and electric vehicles. The DC leakage current detector includes a pair of transformers that act to generate a net output voltage on detection windings thereof that is indicative of the presence of a leakage current in conductors of the DC power circuit at a location being monitored by the DC leakage current detector.

While embodiments of the invention are described below as part of a plug-in electric vehicle implantation/embodiment, it is recognized that embodiments of the invention may also be incorporated into hybrid plug-in electric vehicles, non-plug-in electric vehicles, and other general DC power circuits with numerous branches (other than in a vehicle environment) where it is desirable to be able to identify the location of a current fault in the circuit. Thus, it is recognized that embodiments of the invention are not meant to be limited to plug-in electric vehicles or electric/hybrid vehicles in general, and that embodiments of the invention may be utilized with/in other general DC power circuits with numerous branches.

Figure 1:
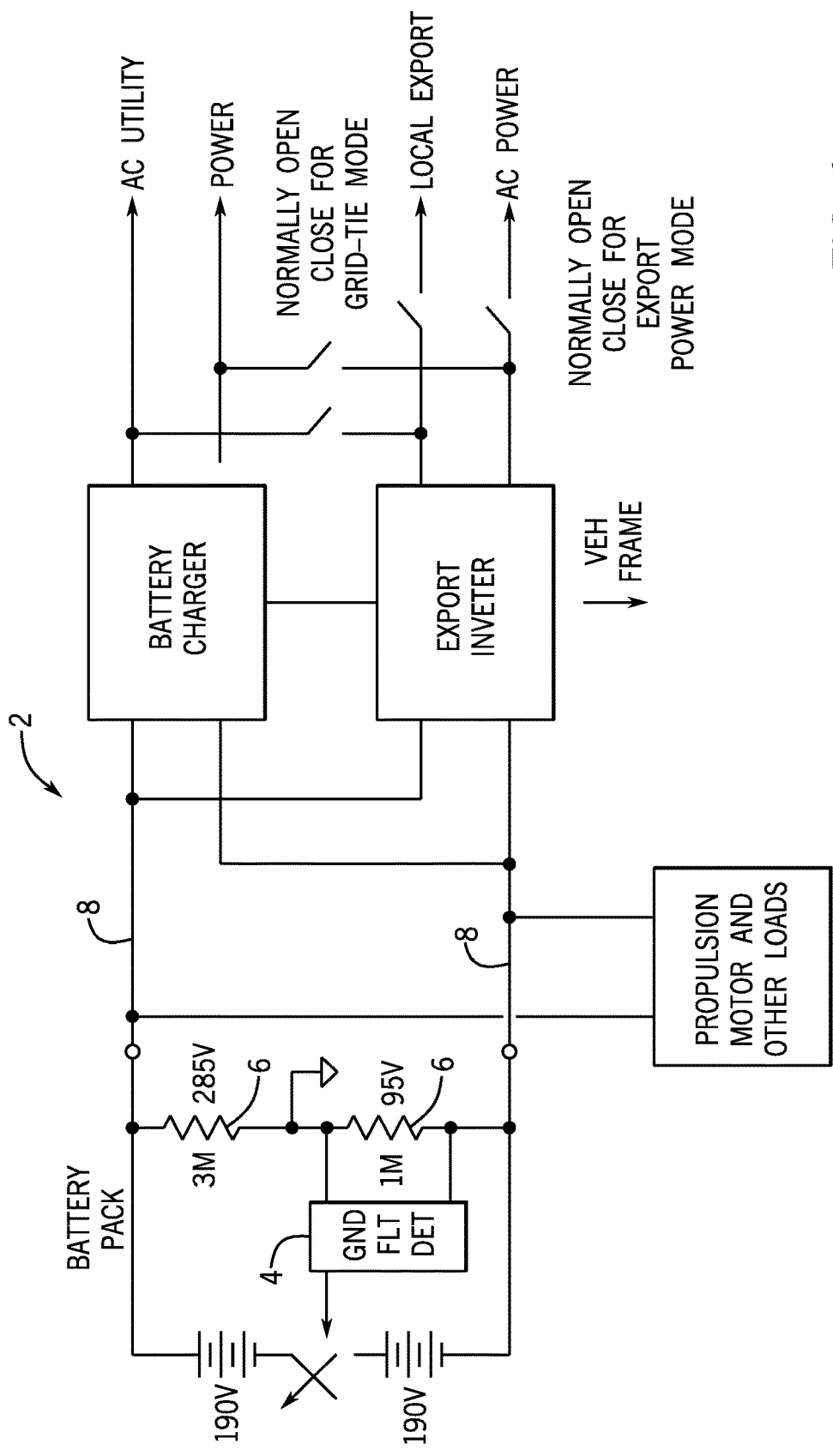
FIG. 1 is a schematic diagram of a DC power circuit in an electric vehicle and associated ground fault detection circuitry, as known in the prior art.
Figure 2:
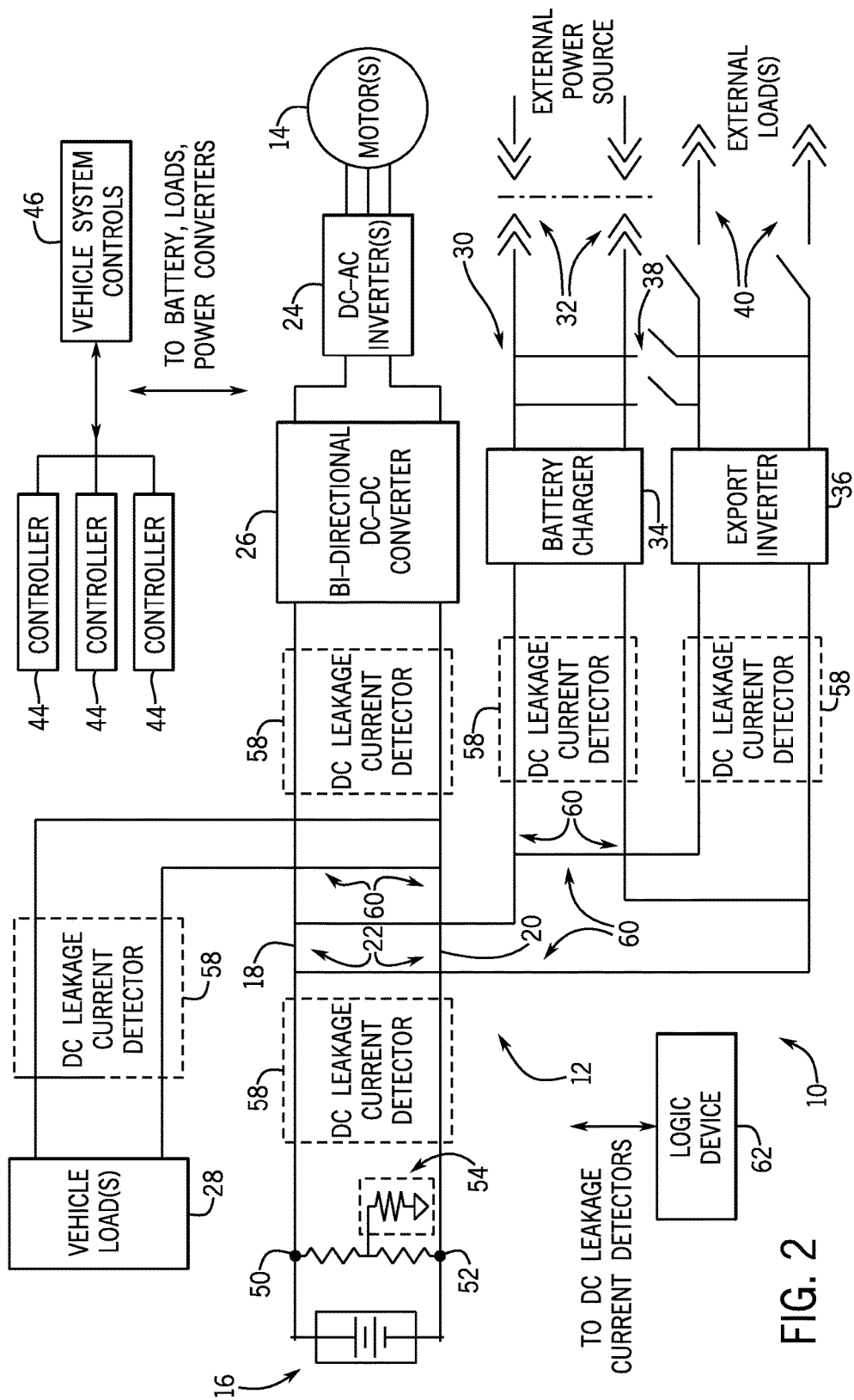
FIG. 2 is a schematic diagram of a DC power circuit in an electric vehicle with a plurality of DC leakage current detectors positioned throughout the circuit, according to an embodiment of the invention.

Referring to FIG. 2, a plug-in electric vehicle 10 is depicted with which and in which embodiments of the invention may be employed. The plug-in electric vehicle 10 includes a DC power circuit 12 that distributes power amongst one or more energy storage devices, loads, and power converters included in the circuit. A typical plug-in electric vehicle 10 includes, as part of DC power circuit 12, an electrical device or machine 14 capable of operating as a motor or a generator. In one embodiment, electrical machine 14 is a traction motor mechanically coupled to one or more driving wheels or axles (not shown) of the vehicle 10 to provide propulsion to the vehicle, when operating as a motor. During a regenerative braking of the vehicle 10, the electrical machine 14 acts as a generator by recovering energy that would normally be lost in the friction braking system.

As shown in FIG. 2, the DC power circuit 12 also includes a traction battery or battery pack 16 that stores energy that can be used by the electrical machine 14. In one embodiment, vehicle battery pack 16 provides a high voltage DC output onto a pair of conductors 18, 20 of a DC distribution bus 22 coupled thereto. One or more power converters 24, 26 may be connected to the DC distribution bus 22. The power converters 24, 26 condition and convert power from the distribution bus 22 into a form useable by the electrical machine 14 and/or other loads 28—with one or more of the power converters 24, 26 configured to provide the ability to bi-directionally transfer energy between the traction battery 16 and the electrical machine 14, for example. According to embodiments, the power converters 24, 26 include a bi-directional DC-to-AC voltage inverter 24 coupled to DC distribution bus 22 to invert a DC power on the DC bus to a three-phase AC power used by the electrical machine 14. In a regenerative mode where the electrical machine 14 acts as a generator, the DC-to-AC voltage inverter 24 may convert the three-phase AC current generated by the electrical machine 14 to the DC voltage compatible with the traction battery 16. The bi-directional DC-to-AC voltage inverter 24 may be of a known construction and include six half phase modules (not shown) that are paired to form three phases. The power converters 24, 26 may also include one or more DC-to-DC voltage converters 26 configured to convert one DC voltage into another DC voltage. Such DC-to-DC voltage converters 26 may be of a known construction and include an inductor coupled to a pair of switches and coupled to a pair of diodes (not shown), with the switches being controlled to buck or boost a voltage from the DC distribution bus 22 to a level suitable for use by electrical machine 14 and or another vehicle load 28 that receives power therefrom—such as a heating module or an air-conditioning module, for example.

When plug-in electric vehicle 10 is parked or not in use, it may be desirable to plug the vehicle into, for example, the utility grid or to a renewable energy source to refresh or recharge the battery pack 16. Accordingly, FIG. 2 shows the DC power circuit 12 of the vehicle 10 including a charging system 30 for the recharging of vehicle battery pack 16. Charging system 30 includes a charge port 32 that may be any type of port configured to receive a charge connector (e.g. power cord/plug) therein to transfer power from the external power source to the vehicle 10. The charge port 32 may be electrically connected to a charger or on-board power conversion module 34 (i.e., "battery charger") that conditions power supplied from the charge port 32 to provide the proper voltage and current levels to the traction battery 16, such as via rectification and/or DC-DC conversion of power received from the external power source. Power conditioned by the battery charger 34 is then provided to the DC distribution bus 22.

In one embodiment, an export power inverter 36 is also included in DC power circuit 12. The export inverter 36 may be provided that is able to invert power received from the DC distribution bus 22 of the vehicle and output an AC power that may be provided back to the utility grid or to another AC load that might require power. As shown in FIG. 2, a plurality of switches 38, 40, e.g., contactors, may be provided to selectively connect an output of the export inverter 36 to either the utility grid or to an external AC load. A first pair of contactors 38 is provided to selectively connect the output of the export inverter 36 to the utility grid and a second pair of contactors 40 is provided to selectively connect the output of the export inverter 36 to the external AC load. Each of the first and second pairs of contactors 38, 40 are normally in an open position but are selectively closed when it is desired to provide AC power from the export inverter 36 to one of the utility grid or the external AC load.

For operating and controlling the various components of the DC power circuit 12 described above, one or more associated controllers 44 is included in the plug-in electric vehicle 10 to control and monitor the operation of the components. The controller(s) 44 may communicate via a serial bus (e.g., Controller Area Network (CAN)) or via discrete conductors, and a system controller 46 may be present to coordinate the operation of the various controllers 44 and their associated components.

As shown in FIG. 2, the traction battery 16 may have a positive terminal 50 and a negative terminal 52 connected to conductors 18, 20 of DC bus 22. Electrical isolation between the traction battery terminals 50, 52 and a chassis ground (i.e., the vehicle frame/chassis) 54 may be maintained according to a minimum value for electrical isolation in a high-voltage system as required by government regulations and/or industry standards, such as an electrical isolation of no less than 500 ohms/Volt between the battery terminals 50, 52 and the chassis ground 54. The chassis ground 54 is defined as a common reference point to which electrical devices of the DC power circuit 12 are electrically connected to. The electrical isolation may be described as a leakage resistance between the chassis ground 54 and a terminal 50, 52 of the traction battery 16. Under normal conditions, a leakage resistance (that may occur at various locations within the DC power circuit 12) will have a relatively large value and little or no leakage current will flow through the chassis ground 54. However, under fault conditions, the leakage resistance can decrease such that larger levels of leakage current flow through the chassis ground 54.

According to embodiments of the invention, a plurality of DC leakage current detectors 58 are placed throughout the DC power circuit 12 of vehicle 10 for detecting the presence of electrical isolation issues. The DC leakage current detectors 58 function to detect leakage current to the vehicle frame 54 that arises from a fault anywhere in the DC power circuit 12, and further function to locate the low leakage current fault—with operation of the DC leakage current detectors 58 enabling a determination of the path of the leakage current within the DC power circuit 12. More specifically, a DC leakage current detector 58 is positioned on each of a number of independent branches 60 of the DC bus 22 of DC power circuit 12, with each branch 60 including thereon a component of the DC power circuit 12 (e.g., battery pack 16, electrical machine 14, DC-AC inverter 24, DC-DC converter 26, battery charger 34, export inverter 36, etc.). In such a manner, each of the independent branches 60 of the DC bus 22 can be separately monitored to detect a leakage current therein.

An exemplary placement of the DC leakage current detectors 58 in/on the DC power circuit 12 is shown in FIG. 2, with each of the detectors 58 being indicated as being positioned around pairs of conductors 18, 20 of its respective branch 60 of the DC bus 22. The path of the leakage current is then determined by observing which DC leakage current detectors 58 detect the leakage current and which DC leakage current detectors 58 do not. The DC leakage current detectors 58 are connected to a logic device 62 that, according to embodiments of the invention, may be incorporated into system controller 46 or may be provided as a separate controller or logic device, with outputs of the DC leakage current detectors 58 being provided to the logic device 62 to determine the fault location. That is, the logic device 62 functions to determine the fault location based on which particular DC leakage current detectors 58 indicate a fault. As one example, a fault at the terminals 50, 52 of the battery charger 16 will cause leakage current to flow from the battery pack 16 to the battery charger 34, such that the DC leakage current detector 58 at the terminals of the battery pack 16 and the DC leakage current detector 58 at the battery charger 34 will detect the fault, while DC leakage current detectors 58 at the terminals of the export inverter 36 and at the propulsion motor 14 will not detect the fault—therefore causing the logic device 62 to determine that the fault is located on a path between the battery pack 16 and the battery charger 34.

Figure 3:
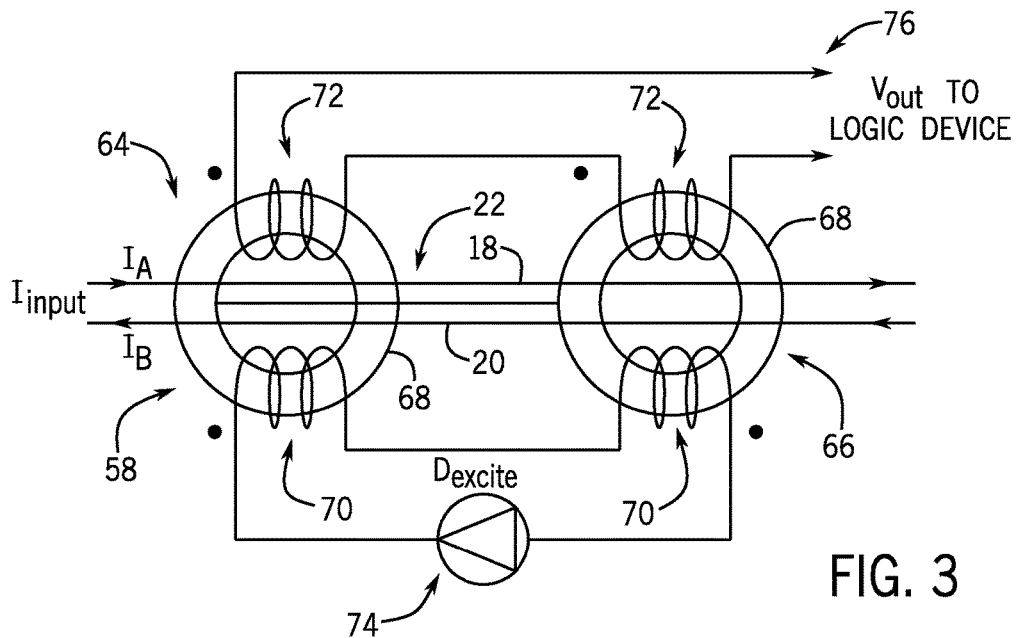
FIG. 3 is a schematic diagram of a DC leakage current detector with unsaturated transformers, according to an embodiment of the invention.
Figure 5:
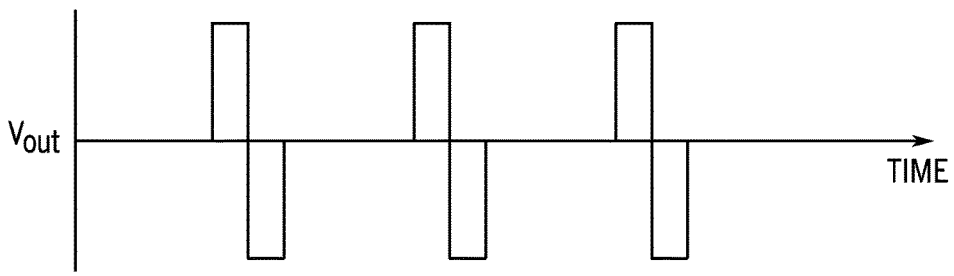
FIG. 5 is a graph illustrating a net voltage output waveform produced by the DC leakage current detector of FIG. 3 responsive to a leakage current in the DC power circuit along the measured branch thereof, according to an embodiment of the invention.
Figure 6:
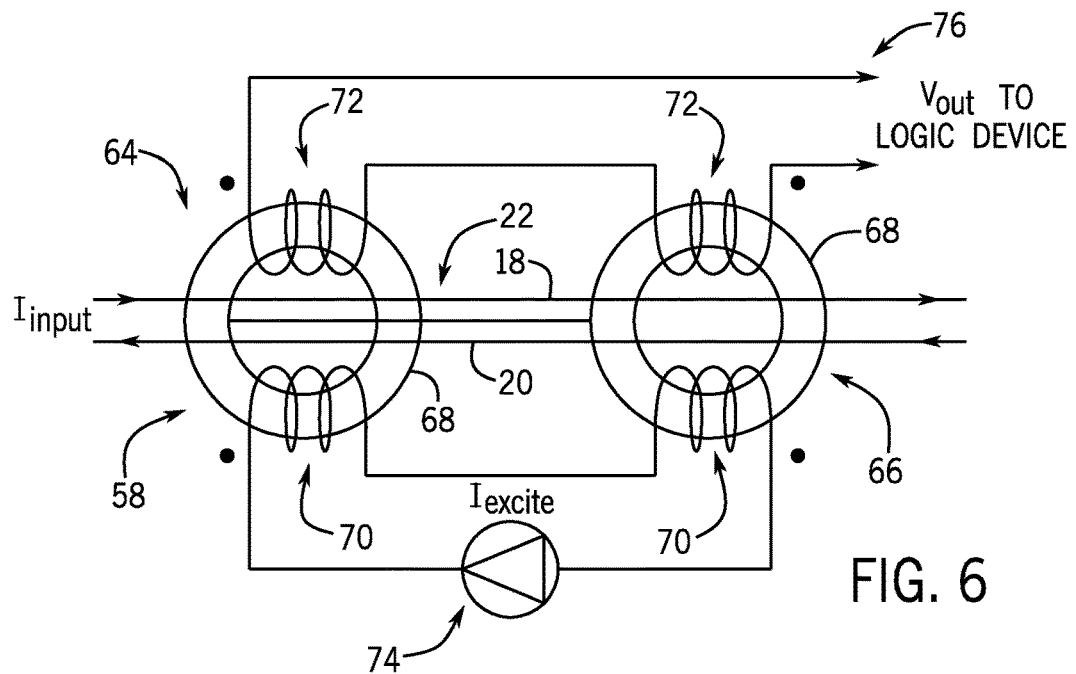
FIG. 6 is a schematic diagram of a DC leakage current detector with saturated transformers, according to an embodiment of the invention.

In general, any sort of sensor that can detect DC leakage current can be used as the DC leakage current detectors 58. However, according to an exemplary embodiment of the invention, the DC leakage current detector 58 is comprised of a pair of transformers, as will be described in greater detail hereafter with respect to FIGS. 3-8, which are directed to a construction of the transformers and operation thereof in detecting DC leakage current. As shown in FIGS. 3 and 6, each DC leakage current detector 58 includes a pair of transformers 64, 66 each formed of a magnetic core 68 and a pair of windings 70, 72, with each of the cores 68 having identical magnetizing characteristics (i.e., B and H field relationships). The cores 68 are constructed such that the conductors 18, 20 of the DC bus 22 pass through an opening formed in the core. Because the main power conductors 18, 20 are usually large gauge wires, and in order to simplify the construction of the power circuits, the main power conductors 18, 20 pass through the cores 68 a small number of times, ideally just once. The pair of windings 70, 72 wound about each core 68 include an excitation winding 70 and a detection winding 72, with the polarities of the windings being indicated in FIGS. 3 and 6 with the usual convention using dots. An excitation/biasing circuit 74 is electrically coupled to the excitation winding 70 of each transformer 64, 66 to selectively inject a current signal thereto, while an output 76 of the detection winding 72 of each transformer 64, 66—i.e., an output 76 of the detector 58—is operably connected to the logic circuit 62 to provide output signals.

Figure 4:
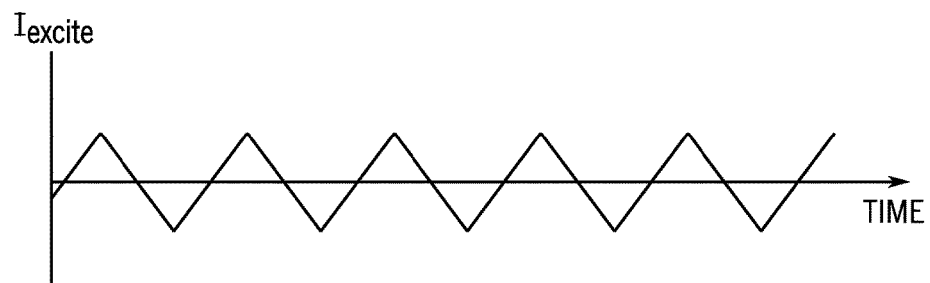
FIG. 4 is a graph illustrating a sawtooth excitation current waveform injected into an excitation windings of the DC leakage current detector of FIG. 3, according to an embodiment of the invention.

According to one embodiment of the invention, and as shown in FIG. 3, the DC leakage current detector 58 detects a leakage current fault by being constructed as and operating its transformers 64, 66 as unsaturated transformers. In operation of the DC leakage current detector 58, the detector is positioned such that the conductors 18, 20 of the DC power system 12 pass through an opening in each of the cores 68 of the transformers, creating a magnetic field that is the sum of the currents. The magnetic field is detected by injecting a small amount of current onto the excitation windings 70 of the transformers 64, 66 via the excitation/biasing circuit 74. A typical excitation current injected by excitation/biasing circuit 74 is shown in FIG. 4 as a sawtooth waveform, but it is recognized that other waveform shapes are possible as well. The function of the excitation current is to create a changing magnetic flux within the cores 68 that slightly saturates the cores.

Upon injection of a current signal into the excitation winding 70 on each of the transformers 64, 66, a voltage is monitored on the detection winding 72 on each of the transformers 64, 66—with the presence or absence of a voltage on the detection windings 72 indicating whether a leakage current is present on the conductors 18, 20 at the monitored location at which the DC leakage current detector 58 is positioned. That is, as long as there is no leakage current through the conductors 18, 20, the flux excursions in each of the cores 68 are equal and opposite. As a result, the voltages generated in each of the detection windings 72 are equal and opposite, and the net voltage at output 76 of the DC leakage current detector 58 is zero. However, the presence of leakage current on the conductors 18, 20 causes the symmetry between the flux waveforms in the two cores 68 to be broken. As a result, there will be brief periods when one core 68 is saturated and the other is not, which will produce a net voltage waveform on the detection windings 72 that is then output from the DC leakage current detector 58 at output 76. An example of such a net voltage waveform at output 76 that is indicative of a leakage current on the conductors 18, 20 is shown in FIG. 5.

Figure 7:
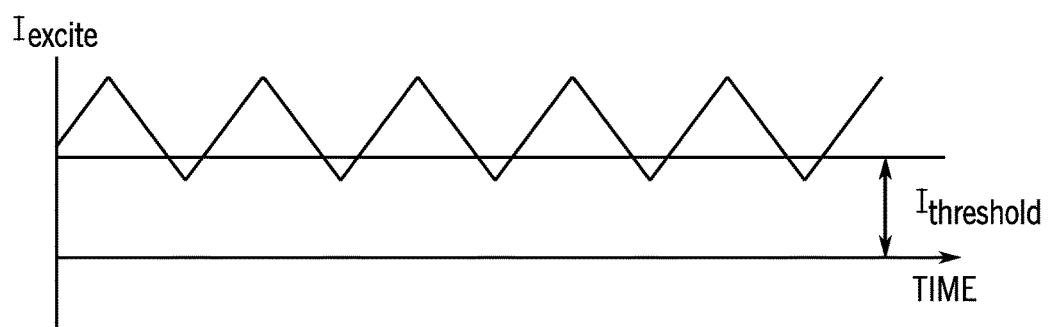
FIG. 7 is a graph illustrating a sawtooth excitation current waveform injected into an excitation windings of the DC leakage current detector of FIG. 6, according to an embodiment of the invention.
Figure 8:
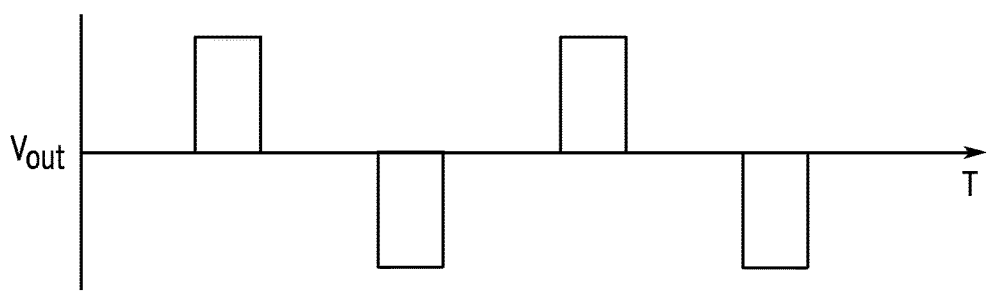
FIG. 8 is a graph illustrating a net voltage output waveform produced by the DC leakage current detector of FIG. 6 responsive to a leakage current in the DC power circuit along the measured branch thereof, according to an embodiment of the invention.

According to another embodiment of the invention, and as shown in FIG. 6, the DC leakage current detector 58 detects a leakage current fault by being constructed as and operating its transformers 64, 66 as saturated transformers. Thus as compared to the unsaturated transformers of FIG. 3, the polarity of one of the windings 70, 72 in the DC leakage current detector 58 is reversed, as can be seen in FIG. 6, and both cores 68 are normally saturated. In operation of the DC leakage current detector 58, the detector is positioned such that the conductors 18, 20 of the DC power system 12 pass through an opening in each of the cores 68 of the transformers 64, 66, creating a magnetic field that is the sum of the currents. The magnetic field is detected by injecting a small amount of current into the excitation windings 70 of the transformers 64, 66 via the excitation/biasing circuit 74, with the injected current signals including a DC bias that maintains the transformer cores 68 in saturation. A sawtooth waveform excitation current that includes a DC bias is shown in FIG. 7 according to one embodiment.

Upon injection of a current signal into the excitation winding 70 on each of the transformers 64, 66, a voltage is monitored on the detection winding 72 of each of the transformers 64, 66—with the presence or absence of a voltage on the detection windings 72 indicating whether a leakage current is present on the conductors 18, 20 at the monitored location at which the DC leakage current detector 58 is positioned. In the unsaturated transformer embodiment of FIG. 6, the presence of leakage current counteracts the bias in one of the transformers 64, 66, taking it out of saturation, which will cause a voltage to appear on the detection windings 72 on that transformer 64, 66, while under unfaulted conditions there will be no signal. A net voltage waveform on the detection winding 72 of the transformer 64, 66 taken out of saturation is then provided to output 76 of the DC leakage current detector 58 and sent to logic device 62, with an example of such a net voltage waveform indicative of a leakage current on the conductors 18, 20 being shown in FIG. 8.

With respect to the injection current signals generated by excitation/biasing circuit 74 that maintain the transformer cores 68 in saturation, it is recognized that since the amount of leakage current is determined by the sizes of the resistors 55, 56 in the DC power circuit 12 in FIG. 2 that are used to maintain a voltage difference between the vehicle frame 54 and the power circuit, the amount of fault current is known ahead of time, and the excitation/biasing circuit 74 can be designed such that the leakage current approximately counteracts the DC bias in one of the cores 68.

Thus, with regard to the saturated and unsaturated transformer constructions/operations shown and described in FIGS. 3-8, it can thus be seen that the embodiments operate on alternating principles with regard to the detection of a leakage current in the conductors 18, 20. Another difference between the embodiments of FIGS. 3 and 6 is that the number of turns for each of the excitation windings 70 does not have to be the same for each core 68 for the saturated transformers 64, 66. In fact, depending on the size of the resistors 55, 56 in FIG. 2, the number of turns for each of the excitation windings 70 would be deliberately different, sized to reflect the difference in the amount of leakage current that flows for a fault from the positive or the negative side of the DC power circuit 12 to the frame 54.

Figure 9:
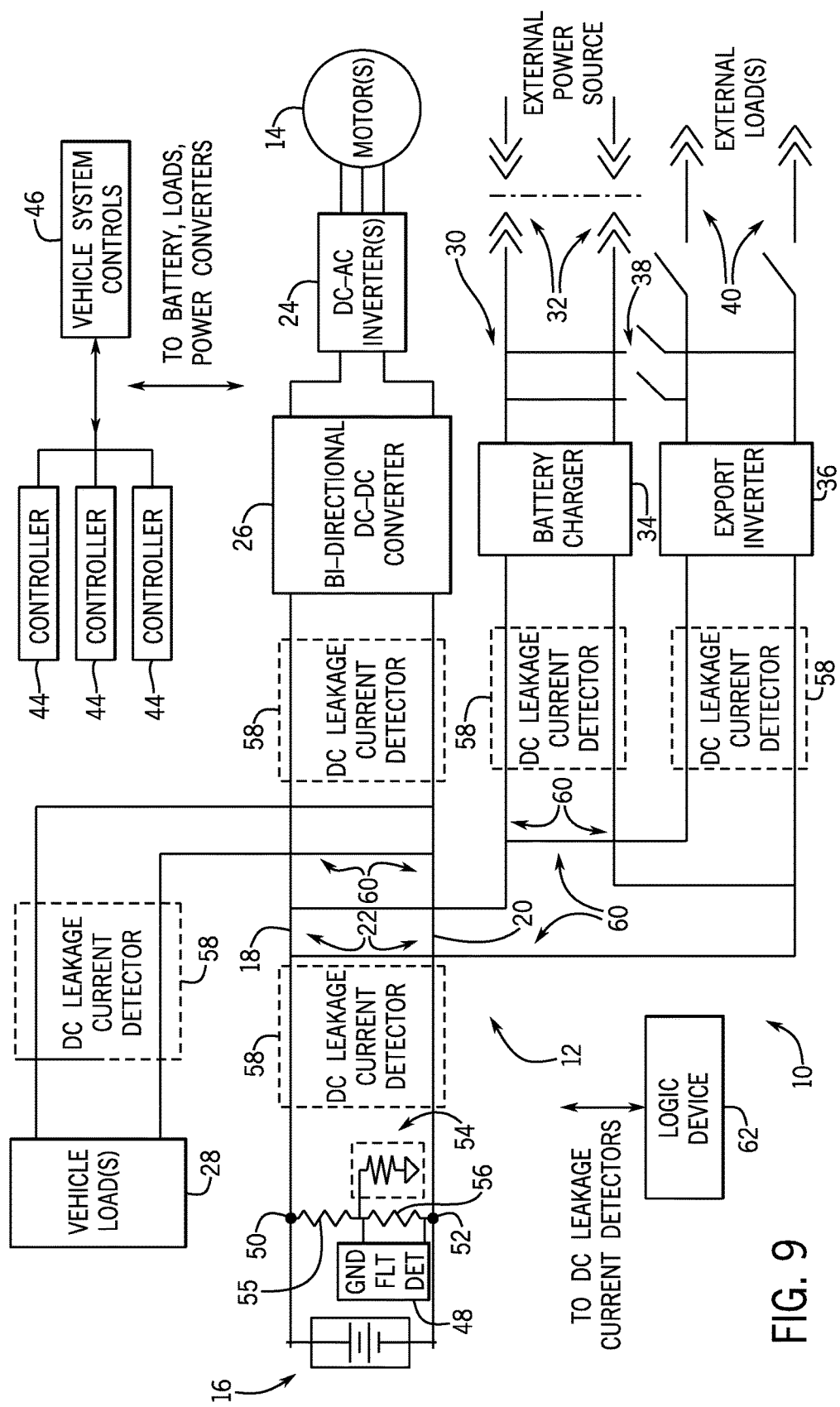
FIGS. 9 and 10 are schematic diagrams of DC power circuits in an electric vehicle with a plurality of DC leakage current detectors positioned throughout the circuit, along with additional ground fault detection circuitry, according to embodiments of the invention.
Figure 10:
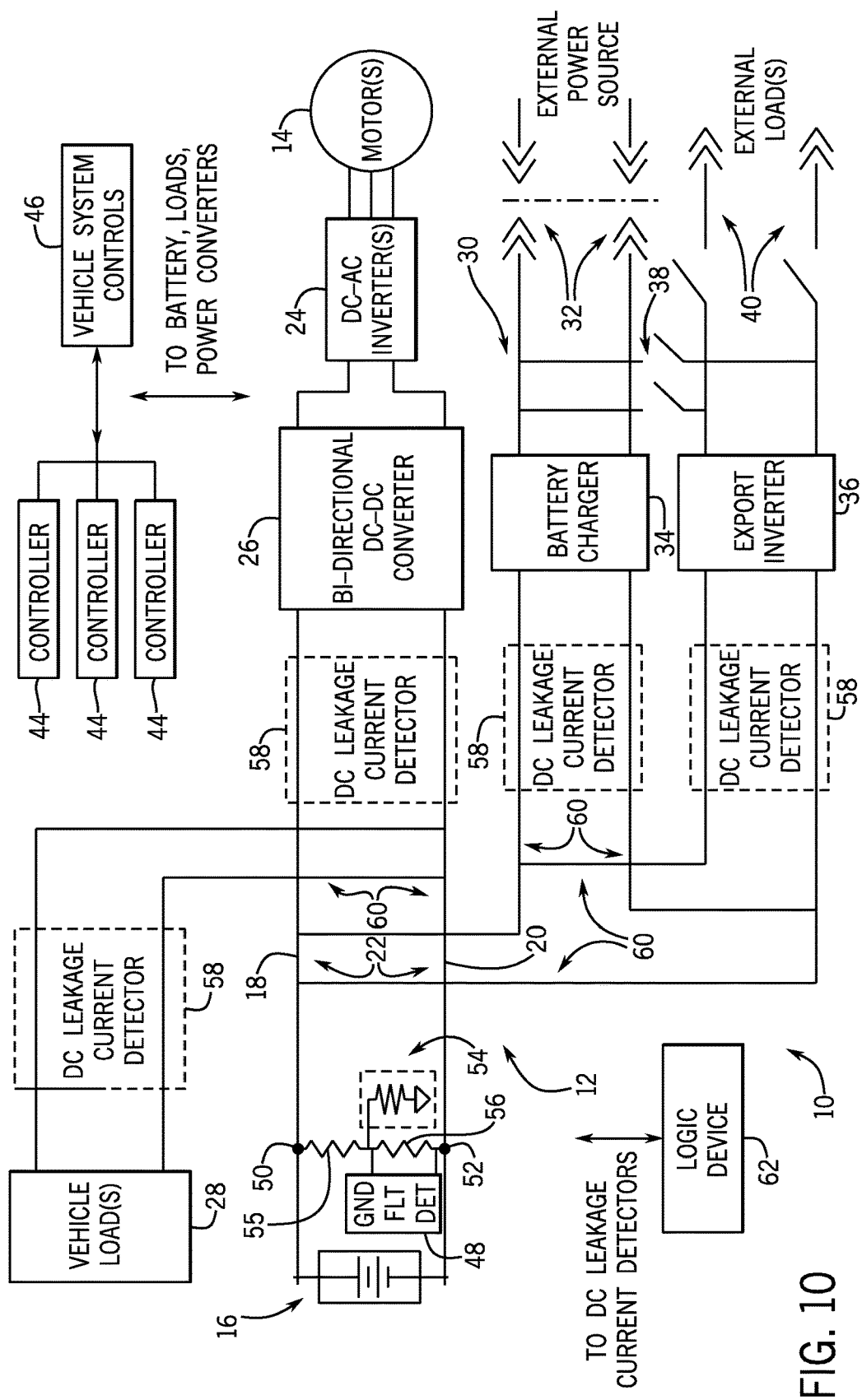

Referring back now to FIG. 2, while the embodiment therein is shown as including a stand-alone DC leakage current detector 58 on each of the independent branches 60 of the DC distribution bus 22 that collectively operate to identify and locate leakage current faults in the DC power circuit without the use of other/additional fault detection circuitry, it is recognized that other embodiments of the invention may include additional ground fault detection circuitry 48. That is, other known ground fault detection circuitry 48 may be used in combination with DC leakage current detectors 58 to monitor the level of leakage current flowing through the chassis ground 54. Examples of such known ground fault detection circuitry 48 that might be used in combination with DC leakage current detectors 58 is shown in FIGS. 9 and 10. As shown therein, the ground fault detection circuitry 48 may be connected to each terminal 50, 52 of the traction battery 16 and to the DC bus 22 and functions to detect a voltage change in/across a pair of resistors 55, 56 that is indicative of a leakage current in the DC power circuit 12. The actual voltage during a fault depends on the ratio of the resistance of the fault leakage path to the resistance of the two biasing resistors 55, 56, with it being recognized that the ratio of the resistance of the usual causes of leakage current to the biasing resistance is low enough to produce a significant change in voltage during a fault. Accordingly, a change in voltage across the either of resistors 55, 56 is easily detected by ground fault detection circuitry 48 to identify the presence of ground fault leakage current to the vehicle frame 54.

In the embodiment of FIG. 9, ground fault detection circuitry 48 is provided for identifying leakage current faults in the DC power circuit 12 and DC leakage current detectors 58 are provided on each of the independent branches 60—including the branch 60 connected to the terminals 50, 52 of the battery charger 16. The DC leakage current detectors 58 may be operated as described above with respect to FIGS. 2-8 to detect the leakage current and locate the fault, with the ground fault detection circuitry 48 providing some redundancy in leakage current fault detection when operated along with the DC leakage current detectors 58 to increase reliability of leakage current fault detection in the DC power circuit 12. In the alternative embodiment shown in FIG. 10, the branch 60 connected to the terminals 50, 52 of the battery charger 16 does not include a DC leakage current detector 58 thereon. In such an embodiment, the location of a leakage fault may still be identified either by the other DC leakage current detectors 58 or, if none of the DC leakage current detectors 58 detects a fault but a fault is detected by the ground fault detection circuitry 48, then it is known that the leakage fault is located on the branch without a DC leakage current detector 58 thereon.

Beneficially, embodiments of the invention thus provide a DC leakage current detector that may be employed for leakage current detection and fault location identification in a DC power circuit in hybrid and electric vehicles. The DC leakage current detector includes a pair of transformers operable as unsaturated or saturated transformers to generate a net output voltage on detection windings thereof that is indicative of the presence of a leakage current in conductors of the DC power circuit at a location being monitored by the DC leakage current detector.

According to one embodiment of the invention, a DC leakage current detector for detecting leakage current in a DC bus is provided. The DC leakage current detector includes a pair of transformers each comprising a magnetic core having an opening positionable about a pair of conductors of the DC bus that create a magnetic field in the magnetic core that is a sum of currents in the conductors and a pair of windings wound about the magnetic core, the pair of windings including an excitation winding and a detection winding. The DC leakage current detector also includes an excitation and biasing circuit connected to the excitation winding in each of the pair of transformers to inject a current signal thereto that creates a changing magnetic flux in the core of each of the transformers and a detector output connected to the detection winding in each of the pair of transformers to receive a voltage therefrom generated responsive to the magnetic flux in the core of each of the transformers, wherein the voltage on the detection windings provides a net voltage at the detector output whose value is indicative of a presence of a leakage current on the DC bus.

In accordance with another embodiment of the invention, a method of sensing a leakage current fault in a DC power circuit includes positioning a DC leakage current detector about a pair of conductors of a DC bus in the DC power circuit, the DC leakage current detector comprising a pair of transformers, each of the pair of transformers including a magnetic core positioned about the pair of conductors and an excitation winding and a detection winding wound about the magnetic core, an excitation and biasing circuit to inject a current signal onto the excitation winding of each transformer, and a detector output coupled to the detection winding of each transformer. The method also includes causing the excitation and biasing circuit to inject the current signal onto the excitation winding of each transformer, thereby creating a changing magnetic flux in the core of each of the transformers. The method further includes measuring a voltage on each of the detection windings generated responsive to the magnetic flux in the core of each of the transformers, with the voltage on the detection windings providing a net voltage at the detector output whose value is indicative of a presence of a leakage current on the DC bus.

In accordance with yet another embodiment of the invention, a DC leakage current detection system for detecting a leakage current fault in a DC bus of a DC power circuit is provided. The DC leakage current detection system includes a plurality of DC leakage current detectors for detecting leakage current in the DC bus at various locations in the DC power circuit, each of the DC leakage current detectors comprises a pair of transformers each including a magnetic core having an opening positionable about a pair of conductors of the DC bus that create a magnetic field in the magnetic core that is a sum of currents in the conductors and a pair of windings wound about the magnetic core, the pair of windings including an excitation winding and a detection winding. Each of the DC leakage current detectors also includes an excitation and biasing circuit connected to the excitation winding in each of the pair of transformers to inject a current signal thereto, the injected current signal creating a changing magnetic flux in the core of each of the transformers. Each of the DC leakage current detectors further includes a detector output connected to the detection winding in each of the pair of transformers to receive a voltage therefrom generated responsive to the magnetic flux in the core of each of the transformers, wherein the voltage on the detection windings provides a net voltage reading at the detector output whose value is indicative of a presence of a leakage current on the DC bus. The DC leakage current detection system also includes a logic device operably connected with the plurality of DC leakage current detectors, the logic device configured to receive the net voltage reading from each of the plurality of DC leakage current detectors and locate the leakage current fault in the DC power circuit based on the net voltage readings received from the plurality of DC leakage current detectors.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A DC leakage current detector for detecting leakage current in a DC bus, the DC leakage current detector comprising:
    a pair of transformers, each of the pair of transformers including:
        a magnetic core comprising an opening positionable about a pair of conductors of the DC bus, the pair of conductors creating a magnetic field in the magnetic core that is a sum of currents in the conductors; and
        a pair of windings wound about the magnetic core, the pair of windings including an excitation winding and a detection winding;
    an excitation and biasing circuit connected to the excitation winding in each of the pair of transformers to inject a current signal thereto, the injected current signal creating a changing magnetic flux in the core of each of the transformers; and
    a detector output connected to the detection winding in each of the pair of transformers to receive a voltage therefrom generated responsive to the magnetic flux in the core of each of the transformers, wherein the voltage on the detection windings provides a net voltage at the detector output whose value is indicative of a presence of a leakage current on the DC bus.

2. The DC leakage current detector of claim 1 wherein the pair of transformers comprise normally unsaturated transformers, with the injected current signal creating the changing magnetic flux to partially saturate the magnetic cores of the transformers.

3. The DC leakage current detector of claim 2 wherein, when no leakage current is present in the conductors, the magnetic flux in the pair of transformers are equal and opposite from one another, such that the net voltage at the detector output is zero.

4. The DC leakage current detector claim 2 wherein, when leakage current is present in the conductors, the magnetic flux in the pair of transformers are unequal from one another, such that the net voltage at the detector output has a non-zero value.

5. The DC leakage current detector of claim 4 wherein, when leakage current is present in the conductors, the magnetic core of one of the pair of transformer is partially saturated for periods of time and the magnetic core of the other of the pair of transformers is unsaturated.

6. The DC leakage current detector of claim 4 wherein, when no leakage current is present in the conductors, the pair of magnetic cores remains in saturation, such that no net voltage is present at the detector output.

7. The DC leakage current detector of claim 4 wherein, when leakage current is present in the conductors, the leakage current counteracts the DC bias in the injected current signal for one of the pair of transformers, so as to cause the one of the pair of transformers to be taken out of saturation, such that the net voltage at the detector output has a non-zero value.

8. The DC leakage current detector of claim 1 wherein the pair of transformers comprise normally saturated transformers, with the injected current signal including a DC bias therein that maintains the pair of magnetic cores in saturation.

9. The DC leakage current detector of claim 8 wherein a magnitude of the DC bias in the injected current signal is controlled based on a known magnitude of leakage current that might be present in the pair of conductors, with the magnitude of the DC bias in the injected current signal being controlled such that the leakage current approximately counteracts the DC bias.

10. The DC leakage current detector of claim 1 wherein the injected current signal comprises a current signal having a sawtooth waveform shape.

11. The DC leakage current detector of claim 1 wherein a number of turns in the excitation winding on one of the pair of magnetic cores differs from a number of turns in the excitation winding on the other of the pair of magnetic cores.

12. A method of sensing a leakage current fault in a DC power circuit, the method comprising:
    positioning a DC leakage current detector about a pair of conductors of a DC bus in the DC power circuit, the DC leakage current detector comprising:
        a pair of transformers, each of the pair of transformers including:
            a magnetic core positioned about the pair of conductors; and
            a pair of windings wound about the magnetic core, the pair of windings including an excitation winding and a detection winding;
        an excitation and biasing circuit to inject a current signal onto the excitation winding of each transformer; and
        a detector output coupled to the detection winding of each transformer;
    injecting the current signal onto the excitation winding of each transformer via the excitation and biasing circuit, thereby creating a changing magnetic flux in the core of each of the transformers; and
    measuring, via the DC leakage current detector, a voltage on each of the detection windings generated responsive to the magnetic flux in the core of each of the transformers, with the voltage on the detection windings providing a net voltage at the detector output whose value is indicative of a presence of a leakage current on the DC bus.

13. The method of claim 12 wherein the pair of transformers comprise normally unsaturated transformers, and wherein causing the excitation and biasing circuit to inject the current signal comprises injecting the current signal to create a changing magnetic flux that partially saturates the pair of magnetic cores of the transformers.

14. The method of claim 13 wherein, when no leakage current is present in the conductors, the magnetic flux in the pair of transformers are equal and opposite from one another, such that the net voltage at the detector output is zero; and wherein, when leakage current is present in the conductors, the magnetic flux in the pair of transformers are unequal from one another, such that the net voltage at the detector output has a non-zero value.

15. The method of claim 12 wherein the pair of transformers comprise normally saturated transformers, and wherein causing the excitation and biasing circuit to inject the current signal comprises injecting a current signal that includes a DC bias therein that maintains the pair of magnetic cores in saturation.

16. The method of claim 15 wherein, when no leakage current is present in the conductors, the pair of magnetic cores remain in saturation, such that no net voltage is present at the detector output; and wherein, when leakage current is present in the conductors, the leakage current counteracts the DC bias in the injected current signal for one of the pair of transformers, so as to cause the one of the pair of transformers to be taken out of saturation, such that the net voltage at the detector output has a non-zero value.

17. The method of claim 15 wherein injecting the current signal that includes the DC bias comprises controlling a magnitude of the DC bias in the injected current signal based on a known magnitude of leakage current that might be present in the pair of conductors, with the magnitude of the DC bias in the injected current signal being controlled such that the leakage current approximately counteracts the DC bias.

18. A DC leakage current detection system for detecting a leakage current fault in a DC bus of a DC power circuit, the DC leakage current detection system comprising:
a plurality of DC leakage current detectors for detecting leakage current in the DC bus at various locations in the DC power circuit, each of the DC leakage current detectors comprising:
a pair of transformers, each of the pair of transformers including:
a magnetic core comprising an opening positionable about a pair of conductors of the DC bus, the pair of conductors creating a magnetic field in the magnetic core that is a sum of currents in the conductors; and
a pair of windings wound about the magnetic core, the pair of windings including an excitation winding and a detection winding;
an excitation and biasing circuit connected to the excitation winding in each of the pair of transformers to inject a current signal thereto, the injected current signal creating a changing magnetic flux in the core of each of the transformers; and
a detector output connected to the detection winding in each of the pair of transformers to receive a voltage therefrom generated responsive to the magnetic flux in the core of each of the transformers, wherein the voltage on the detection windings provides a net voltage reading at the detector output whose value is indicative of a presence of a leakage current on the DC bus; and
a logic device operably connected with the plurality of DC leakage current detectors, the logic device configured to:
receive the net voltage reading from each of the plurality of DC leakage current detectors; and
locate the leakage current fault in the DC power circuit based on the net voltage readings received from the plurality of DC leakage current detectors.

19. The DC leakage current detection system of claim 18 wherein the pair of transformers in a respective DC leakage current detector comprise normally unsaturated transformers, with the injected current signal creating the changing magnetic flux to partially saturate the magnetic cores of the transformers; and wherein the net voltage reading at the detector output is zero when no leakage current is present in the conductors and the net voltage reading at the detector output is a non-zero value when leakage current is present in the conductors.

20. The DC leakage current detection system of claim 18 wherein the pair of transformers comprise normally saturated transformers, with the injected current signal including a DC bias therein that maintains the pair of magnetic cores in saturation; and wherein no net voltage reading is present at the detector output when no leakage current is present in the conductors and the net voltage reading at the detector output has a non-zero value when leakage current is present in the conductors.

* * * * *